United States Patent
Liu et al.

(10) Patent No.: US 7,109,748 B1
(45) Date of Patent: *Sep. 19, 2006

(54) INTEGRATED CIRCUITS WITH REDUCED STANDBY POWER CONSUMPTION

(75) Inventors: Yow-Juang W Liu, San Jose, CA (US); Hugh Sungki O, Fremont, CA (US); Richard G Cliff, Los Altos, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/147,759

(22) Filed: Jun. 7, 2005

Related U.S. Application Data (63) Continuation of application No. 10/691,756, filed on Oct. 22, 2003, now Pat. No. 6,940,307.

(51) Int. Cl.
*H03K 19/173* (2006.01)

(52) U.S. Cl. .............. 326/38; 326/39; 326/41; 326/113; 365/182; 365/189.09

(58) Field of Classification Search .......... 326/38; 365/229; 257/299
See application file for complete search history.

(56) References Cited

U.S. PATENT DOCUMENTS

| | | | |
|---|---|---|---|
| 5,068,603 A | 11/1991 | Mahoney | |
| 5,471,421 A | 11/1995 | Rose et al. | |
| 5,959,891 A | 9/1999 | Sansbury | |
| 6,163,044 A * | 12/2000 | Manning | 257/299 |
| 6,353,551 B1 | 3/2002 | Lee | |
| 2004/0252573 A1* | 12/2004 | Hanson et al. | 365/229 |

* cited by examiner

*Primary Examiner*—Vibol Tan
(74) *Attorney, Agent, or Firm*—Fish & Neave IP Group of Ropes & Gray LLP; Robert R. Jackson; Hong S. Lin (57) ABSTRACT

Integrated circuit standby power consumption may be reduced using a reverse-bias transistor control arrangement that reduces transistor leakage current. Integrated circuit transistors may be turned off using a reverse bias voltage rather than a ground voltage. A charge pump circuit on the integrated circuit may be used to generate the reverse bias voltage. The reverse bias voltage may also be provided from an external source. The integrated circuit may be a programmable logic device in which logic is configured by providing programming data to configuration cells. The configuration cells may be used to apply either a positive power supply voltage to a given transistor to turn that transistor on or to provide the reverse bias voltage to that transistor to turn that transistor off.

20 Claims, 7 Drawing Sheets

INTEGRATED CIRCUITS WITH REDUCED STANDBY POWER CONSUMPTION

This is a continuation of U.S. patent application Ser. No. 10/691,756, filed Oct. 22, 2003, now U.S. Pat. No. 6,940,307, which is incorporated by reference herein in its entirety.

BACKGROUND OF THE INVENTION

This application relates to circuitry for integrated circuits such as programmable logic array integrated circuits ("programmable logic devices"), and more particularly, to circuitry that allows integrated circuits and systems using such circuits to minimize standby power consumption due to transistor leakage currents.

Modern integrated circuits are often based on metal-oxide-semiconductor (MOS) technology. Such integrated circuits have numerous metal-oxide-semiconductor field-effect transistors (MOSFETs). As fabrication techniques improve, it becomes possible to fabricate MOSFETS and other circuit components with smaller critical dimensions. For example, it becomes possible to fabricate MOSFETs with shorter gates. These shorter-gate MOSFETs can have improved performance characteristics with respect to longer MOSFETs.

Excessive power supply voltages lead to large power requirements for the integrated circuit. The trend has therefore been to use lower and lower power supply voltages on successive generations of integrated circuits. Modern integrated circuits often have power supply voltages of only 1.0 or 1.2 Volts.

With a power supply voltage this low, it becomes necessary to reduce the threshold voltage of certain transistors to a low level to maintain transistor performance at an acceptable level, particularly in speed-critical applications. However, low-threshold shorter-gate transistors can exhibit high levels of leakage current when turned off. As a result, the standby power consumption of integrated circuits with large numbers of low-threshold shorter-gate transistors may be much larger than desired.

Previously-known techniques for addressing high standby power consumption have not been entirely satisfactory. For example, one approach that has been proposed involves shutting down the power supply voltage to large areas of the integrated circuit when those areas are not in use. While this approach may reduce standby power consumption, it may not always work. For example, certain integrated circuits such as programmable logic device integrated circuits have circuitry that is programmed by a user. Because the user can change the configuration of the logic on the device before the device is placed into service in a system, it is not generally known in advance which areas of the integrated circuit should be shut down by removing the power supply voltage.

A better way to reduce integrated circuit standby power consumption is therefore needed.

SUMMARY OF THE INVENTION

In accordance with the present invention, integrated circuits are provided that have improved standby power consumption properties. The integrated circuits may be used in data processing systems to reduce the overall power consumption of such systems.

The integrated circuits may be digital integrated circuits such as programmable logic devices or other integrated circuits containing logic circuitry. Programmable logic devices may contain transistors such as MOS transistors. The transistors may be used to selectively connect various portions of the logic on the programmable logic device. For example, the transistors may function as pass transistors that connect relatively long conductors on the circuit (called interconnects) and may function as building block elements in programmable components such as multiplexers, look-up tables, logic arrays, etc.

The transistors in the programmable logic devices and other integrated circuits have control gates that may be used to selectively control conduction between their source and drain terminals. When a logic high signal is applied to a given transistor's control gate, the transistor is turned on and the source becomes electrically connected to the drain. When turned on, signals (e.g., digital logic signals) may pass between the transistor's source and drain terminals. When a logic low signal is applied to the given transistor's control gate, the transistor is turned off. This electrically isolates the source and drain terminals and prevents signals (e.g., digital logic signals) from passing between the source and drain terminals.

In programmable logic devices and other integrated circuits, there are often numerous transistors (e.g., thousands of transistors or millions of transistors). Some of these transistors are effectively always in an "on" condition due to their placement in the circuit. Other transistors are frequently turned off. In some circuit designs, about 95% of the transistors may be turned off while about 5% of the transistors remain always on.

The quiescent power consumption of a circuit when its transistors are turned off is referred to as its "standby" power consumption. In most systems it is desirable to reduce power consumption as much as possible. Reduced power consumption lowers heat production and thereby alleviates thermal management concerns. Reduced power consumption also extend battery life if a battery is being used and conserves energy. To reduce the power consumption of an integrated circuit effectively, it is generally necessary to address both the amount of power being consumed by the circuit when its circuitry is active and the amount of power being consumed by the circuit when its circuitry is in a standby condition.

Power consumption by MOS transistors in their off state is driven by leakage current. If an integrated circuit has transistors with high leakage currents in their off state, that integrated circuit will have a relatively high standby power.

In accordance with the present invention, transistors may be turned off using a reverse-bias voltage (e.g., a negative voltage in an environment in which circuitry is generally driven using a positive power supply voltage and a ground voltage). The reverse-bias voltage reduces the leakage current of the transistors to which it is applied below the leakage current level that would have been exhibited if those transistors had been turned off using a ground voltage (i.e., a ground voltage of 0 V). Because the reverse-bias voltage turns off the transistors on the integrated circuit much more completely than would be the case if those transistors had been turned off using a ground voltage, this approach substantially reduces the standby power consumption of the integrated circuit.

In integrated circuits such as programmable logic devices, programming data may be provided to control circuits such as programmable random-access memory cells or other suitable function control elements. The programming data may be used by this control circuitry to configure programmable transistors on the integrated circuit. In one suitable arrangement, each control circuit (e.g., each programmable random-access memory cell) may be used to store either a "1" bit or a "0" bit. The output of each control circuit is applied to the control gate of a respective programmable transistor.

The value of the programming data stored by each control circuit determines the voltage of the output signal provided by that control circuit. For example, when a control circuit is provided with programming data that directs that control circuit to produce a high output, the control circuit may produce a voltage at its output that is equal to a power supply voltage. This signal may be applied to the control gate of the associated transistor to turn that transistor on. In order to reduce leakage current (and thereby reduce the standby power consumption of the integrated circuit containing the transistor), the control circuit may provide a reverse-bias voltage at its output when the control circuit is provided with programming data that directs that control circuit to produce a low output. The reverse-bias voltage that is produced by the control circuit (e.g., by the configuration random-access memory cell) turns off its associated transistor more completely than would a ground voltage (e.g., 0 V).

If desired, the control circuitry on the integrated circuit that is used to control the programmable transistors may be used to apply the reverse-bias control voltage particularly (or only) to those transistors with low-threshold voltages and/or with short gate lengths (e.g., gate lengths of 90 nm or less). As an example, an integrated circuit may have some transistors that have relatively high threshold voltages (e.g., 0.4 volts), other transistors with moderate threshold voltages (e.g., 0.3 volts), and still other transistors with relatively lower threshold voltages (e.g., 0.2 volts). If desired, some or all of the higher-threshold-voltage transistors (e.g., some or all of the 0.4 volt threshold transistors and some or all of the 0.3 volt threshold transistors) may be turned off using a ground voltage (e.g., 0 V), whereas the control circuitry may use the reverse-bias voltage to turn off some or all of the lower-threshold-voltage transistors (e.g., those with 0.1 volt thresholds). With this arrangement, the use of the reverse-bias turn-off signal is applied where it is most effective—the low-threshold-voltage transistors.

The transistors that are turned off using the reverse-bias threshold voltage may be pass transistors that connect interconnects on the integrated circuit, may be transistors in programmable components such as multiplexers (and demultiplexers), may be transistors in programmable logic array circuits, may be transistors in programmable look-up-table logic, or may be any other suitable transistors on a programmable logic device or other integrated circuit.

The control circuitry used to turn the transistors on and off may be based on configuration random-access memory cells. Each configuration random-access memory cell may use a pair of cross-coupled inverters to store a bit of associated programming data. The stored bit may direct the configuration random-access memory cell to produce either a power supply voltage or a reverse-bias voltage at the output of the configuration random-access memory cell. If desired, some configuration random-access memory cells (e.g., those used to control higher-threshold-voltage transistors on the same integrated circuit) may be used to produce either a power supply voltage or a ground voltage at their outputs.

The configuration random-access memory cells may contain transistors such as transistors in the cross-coupled inverters, address-line transistors, and clear-line transistors. Some or all of these configuration random-access memory cell transistors (e.g., particularly those with lower threshold voltages or those potentially exposed to greater source-drain voltages such as the clear transistors in some designs) may be turned off using control circuitry that selectively provides a reverse-bias-turn-off voltage to the control gates of these transistors.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
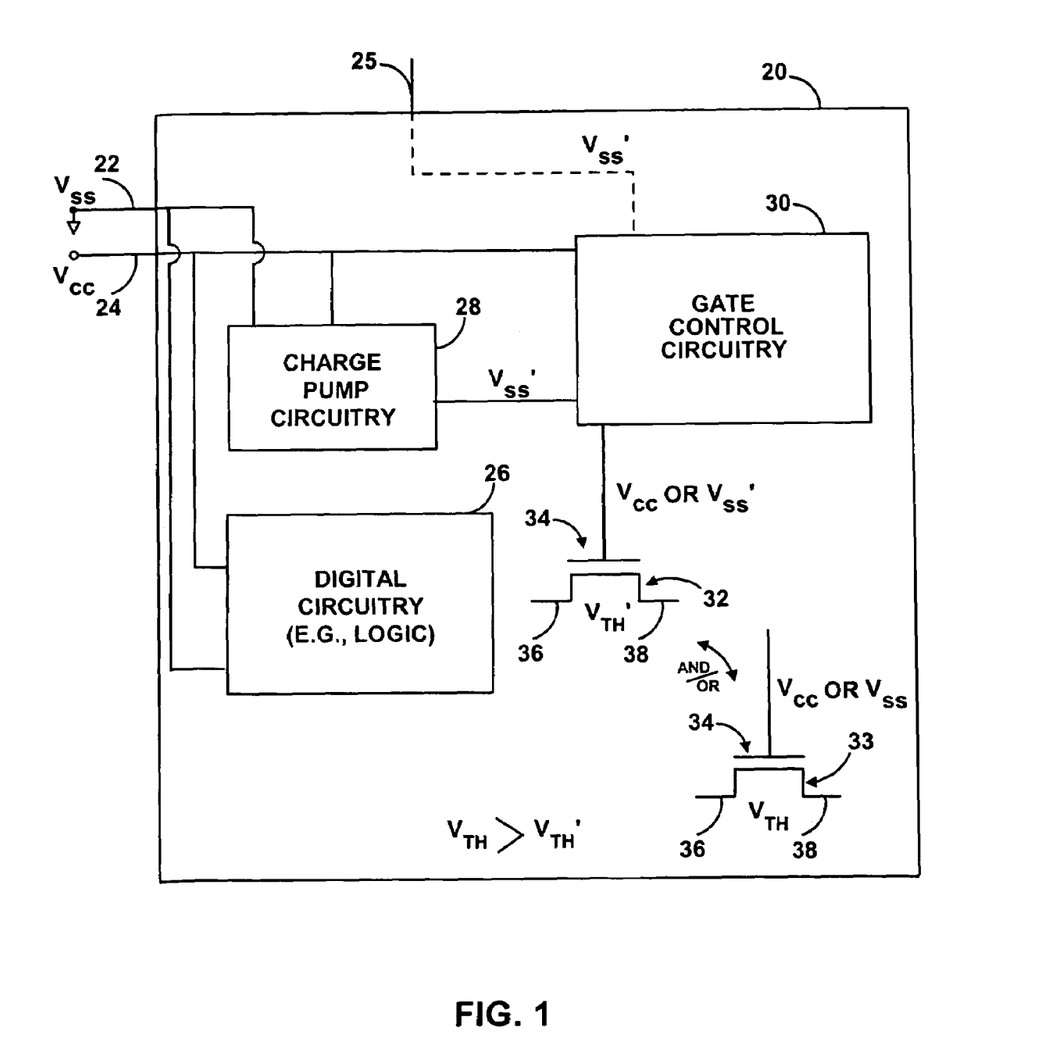
FIG. 1 is a diagram of an illustrative integrated circuit having circuitry that reduces standby power consumption in accordance with the present invention.

An illustrative integrated circuit 20 having circuitry for reducing the integrated circuit's standby power consumption in accordance with the present invention is shown in FIG. 1. For clarity, the following discussion will focus on integrated circuits 20 based on metal-oxide-semiconductor field-effect-transistor (MOSFET) technology. This is, however, merely illustrative. For example, integrated circuit 20 may have bipolar transistors or may be based on a different materials system (e.g., SiGe or GaAs). Moreover, the components of integrated circuit 20 may be spread across one or more separate semiconductor die, but are described in the context of a single integrated circuit for clarity.

Integrated circuit 20 may be provided with power through a number of power supply pins or other suitable electrical connections (e.g., solder balls in a flip-chip ball-grid-array packaging arrangement). In the example of FIG. 1, power is provided to circuit 20 through power supply pins such as pins 22 and 24. With one suitable arrangement, circuit 20 receives power at a ground voltage Vss and a power supply voltage of Vcc. In one illustrative arrangement, Vss is 0 volts and Vcc is 1.2 volts. This illustrative arrangement will be assumed during the following discussion for the sake of clarity. This arrangement is, however, merely illustrative. Any suitable voltage levels and polarities may be used in connection with the present invention if desired.

Integrated circuit 20 may be an analog integrated circuit, a digital integrated circuit, or a circuit that includes both analog and digital circuitry. For purposes of illustration, the present invention will be described primarily in the context of integrated circuits having at least some digital circuitry 26 (and in particular some logic circuitry). This is, however, merely illustrative. Any suitable circuitry may be provided on integrated circuit 20 if desired.

The circuitry of integrated circuit 30 (e.g., the digital circuits on circuit 30) typically include a number of transistors such as transistors 32 and/or 33. These transistors may have a source 36 at a first terminal, a drain 38 at a second terminal, and a controlling gate electrode 34 at a third terminal. Some of the other circuitry on integrated circuit 20 (called gate control circuitry 30 in FIG. 1 and called control circuitry or control circuits elsewhere) may be used to control transistors such as transistors 32 and 33. The gates of many transistors on circuit 20 are either supplied with a high voltage (e.g., a logic high level) such as Vcc (e.g., 1.2 volts) or a low voltage (e.g., a logic low level) such as Vss (e.g., 0 volts).

When a high signal is applied to a given transistor, an inversion layer is formed beneath gate 34 which turns the transistor on. This allows signals to pass through the transistor. When a low signal is applied to transistor 32 or 33, the transistor is turned off. Thus, many of the transistors on circuit 20 act as switches, which either block signals or let signals pass between their source and drain terminals, depending on the state of the control signal applied to their gate control terminals 34.

The power consumption of the transistors on circuit 20 falls substantially when the transistors are turned "OFF." However, there is a non-negligible amount of power dissipation associated with each transistor, even when it is turned off. This off-state power dissipation is referred to as "standby" power dissipation. Because there may be thousands or millions of transistors on a given circuit, the standby power dissipation of most integrated circuits can be substantial.

Non-negligible power dissipation during standby conditions arises from the leakage current associated with the transistors when turned off. To reduce the standby power consumption of circuit 20, some or all of the transistors that are turned off may be provided with a "reverse bias" control voltage Vss' rather than simply applying a control voltage of Vss.

The voltage Vss' may (in this example) be less than 0 volts (i.e., Vss' may be negative when the polarity of the power supply voltage is positive). For example, Vss' may be −0.2 V. The reverse-bias control voltage Vss' turns off the transistors more completely than the control voltage Vss, thereby reducing their leakage current. By using control circuitry such as gate control circuitry 30 to apply the reverse bias control voltage Vss' to many of the transistors on circuit 20 when those transistors are to be turned off, the standby power consumption of circuit 20 (and therefore its overall power requirements) can be reduced substantially. The power consumption of the system in which circuit 20 is operated is also reduced.

The voltage Vss' may be provided to circuit 20 using a pin or electrical connector such as pin 25 or may be generated using circuitry on circuit 20. For example, charge pump circuitry 28 may be provided on circuit 20 that provides the voltage Vss' to gate control circuitry 30, as shown in FIG. 1.

The charge pump circuitry 28 may include one or more charge pump circuits that produce a negative voltage Vss' from ground (Vss) and a positive power supply voltage (Vcc). The charge pump circuits and other circuitry of circuit 20 may be provided in one or more specific locations or may be distributed throughout circuit 20. If desired, control signals and power supply voltages may be distributed using conductors (lines) that are distributed throughout circuit 20. For example, one or more charge pump circuits near the periphery of circuit 20 may be used to generate signals at the voltage level Vss' that are distributed throughout the circuit 20 by power supply conductors for use by gate control circuitry 30 in controlling transistors such as transistor 32.

The transistors on circuit 20 may be fabricated so that they have different threshold voltages. For example, some transistors may be configured to have relatively higher threshold voltages (e.g., VTH=0.4 volts), others may be configured to have moderate threshold voltages (e.g., 0.3 volts), and still others may be configured to have relatively lower threshold voltages (e.g., VTH'=0.2 volts). The decision as to which transistors to provide with which threshold voltages depends on the intended use of the transistor and its circuit environment.

Transistors with higher threshold voltages exhibit lower levels of standby leakage current than transistors with lower threshold voltages for a given off voltage. Accordingly, non-critical transistors (e.g., transistors that are not in a high-speed data path) may be provided with high threshold voltages to help reduce standby power consumption. Transistors with lower threshold voltages are often preferred in speed-critical applications to ensure high-levels of performance. For example, the pass transistors that are used to selectively join various high-speed data lines and other interconnects are preferably provided with low threshold voltages.

The use of the reverse bias voltage Vss' to turn off the transistors of circuit 20 reduces leakage current the most for low-threshold transistors, reduces leakage somewhat for medium-threshold transistors, and reduces leakage to a lesser extent for high-threshold transistors. As a result, it may be particularly advantageous to use the reverse bias voltage Vss' to turn off the transistors with the low (or even medium) thresholds. Using the reverse bias voltage Vss' to turn off these transistors has the greatest impact in reducing the standby power consumption (on a per-transistor basis). Because there is overhead associated with providing charge pump circuitry 28 and gate control circuitry 30 to allow transistors 32 to be turned off with reverse bias signal Vss', it may be desirable to turn off some of the transistors (e.g., some or all of the high-voltage-threshold transistors 33) using Vss and to turn off other transistors (e.g., some or all of the low-voltage-threshold transistors 32) using Vss'.

Circuit 20 may be a programmable logic device. Programmable logic devices are integrated circuit devices in which logic can be customized by a user before the programmable logic device is used in operation in a system. The customized device may be used to perform customized logic functions.

A user can customize a programmable logic device using equipment called a "programmer" to supply configuration information (called "programming data") to configurable components on the device. Once the programmable logic device has been properly configured, it can be used in a system (e.g., by mounting it on a circuit board as with other integrated circuits). Some programmable logic devices may be reconfigured after being installed in a system (e.g., they may be in-system reprogrammable).

Programmable logic devices may be based on various different types of programmable logic components and technologies, such as those based on fuses, antifuses, programmable-erasable-read-only memories (PROMS), erasable PROMS (EPROMS), electrically-erasable PROMS (EEPROMS), flash memory, random-access-memory (RAM) devices (e.g., configuration RAM cells), etc. Some of these programmable components may be used to control transistors such as transistor 32 of FIG. 1 (i.e., some of these programmable components may perform the functions of gate control logic 30). Other programmable components may take the place of transistors such as transistor 32.

For clarity, the present discussion of ways to reduce standby power consumption in programmable logic devices focuses primarily on arrangements in which MOSFETs are controlled by gate control logic 30 that is based on configuration RAM cells (shown in the drawings by a circle around the letter "R"). This type of arrangement is merely illustrative. For example, some or all of the gate control circuitry 30 can be provided using other types of configurable devices (e.g., those based on fuses, antifuses, programmable-erasable-read-only memories (PROMS), erasable PROMS (EPROMS), electrically-erasable PROMS (EEPROMS), flash memory, etc.). Nevertheless, the present discussion focuses on the use of RAM cells for clarity.

Figure 2:
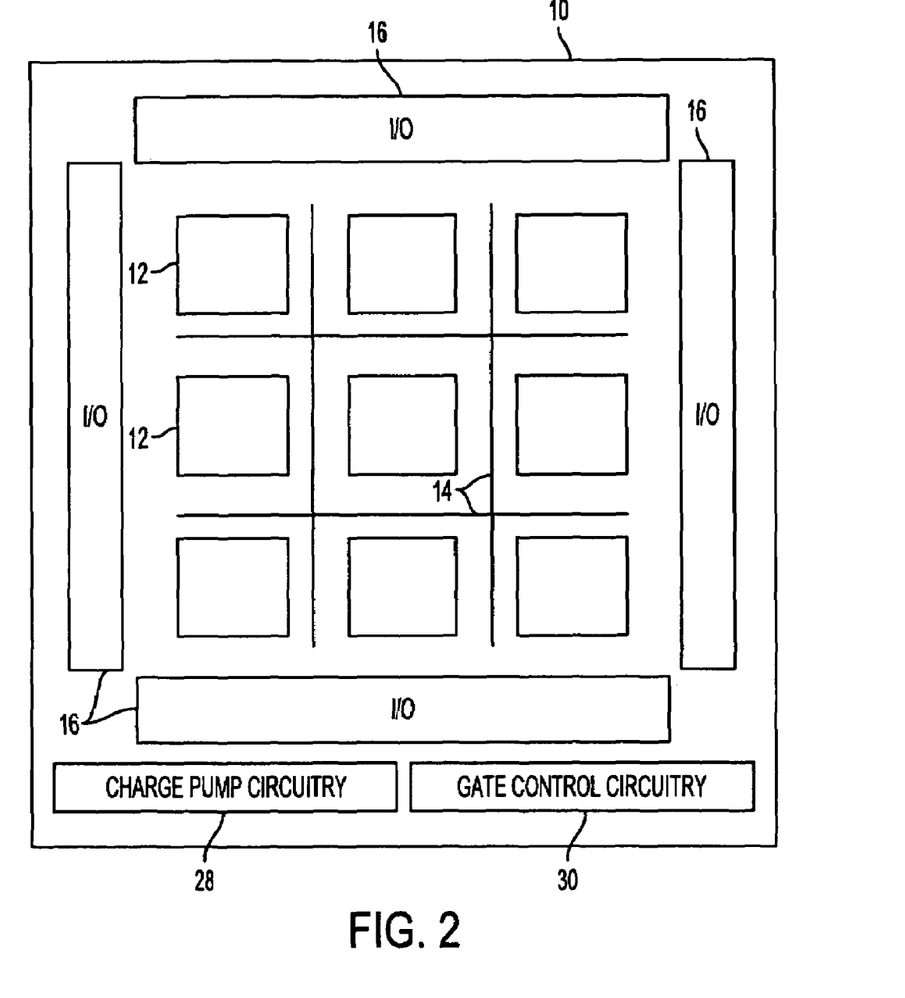
FIG. 2 is a diagram of an illustrative programmable logic device integrated circuit having circuitry that reduces standby power consumption in accordance with the present invention.

An illustrative programmable logic device arrangement that may be used for integrated circuit 20 of FIG. 1 when integrated circuit 20 is a programmable logic device (or contains programmable logic circuitry) is shown in FIG. 2. Programmable logic device 10 of FIG. 2 has number of rows and columns of regions 12 of programmable logic. Regions 12 may be disposed on device 10 in a two-dimensional array of, for example, 5–300 rows and 5–300 columns of regions 12 or any other suitably-sized array.

The logic in regions 12 of device 10 may be interconnected using interconnection resources such as vertical and horizontal conductors 14. Such conductors may, for example, include relatively large inter-region conductors that extend past all or some of the logic regions 12 in a row or column. There may be any suitable number of conductors 14. For example, there may be about 10–30 conductors 14 in each row and each column of regions 12. Programmable logic may be used to selectively connect all or a subset of the conductors 14 in each row or column to the associated logic regions 12 in that column. If desired, programmable logic may also be used to directly interconnect the vertical and horizontal conductors 14. The conductors 14 may be continuous or segmented and, if segmented, may be programmably connected to serve as continuous conductors.

Input-output circuitry 16 may be used to interconnect the logic of device 10 to external components (e.g., through I/O pads connected to pins in a package). Additional circuitry may also be used such as circuitry for programming and testing device 10. To avoid over-complicating the drawing, details of the programmable logic interconnections and programming and testing circuitry of device 10 are not shown in FIG. 2. Moreover, the arrangement of FIG. 2 is merely illustrative. Any suitable programmable logic device architecture may be used for device 10 if desired.

As shown in FIG. 2, programmable logic device 10 may include charge pump circuitry 28. Charge pump circuitry 28 may be used to produce a reverse bias voltage Vss' from a ground voltage Vss (e.g., 0 volts) and a positive power supply voltage Vcc (e.g., 1.2 volts). The voltage Vss' may also be produced from other voltage sources or may be provided from a source external to device 10 (e.g., through a Vss' supply pin). Device 10 may have gate control circuitry 30 for controlling transistors 32 in the digital logic circuitry of I/O circuitry 16, connectors 14, and logic regions 12.

Figure 3:
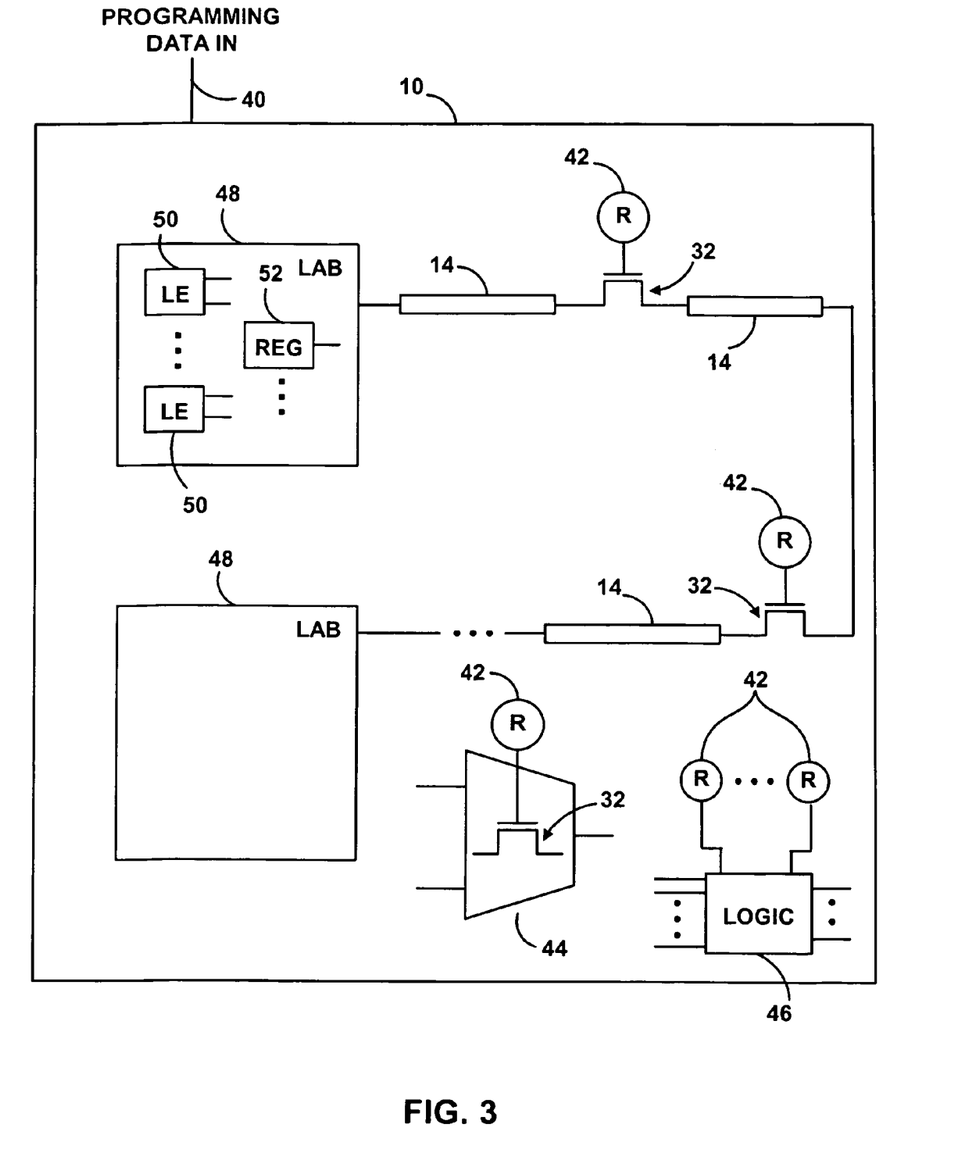
FIG. 3 is a diagram of an illustrative programmable logic device showing some of the programmable components that may be provided on such a device in accordance with the present invention.

Programmable logic device 10 may be shipped to a customer ("user") in a substantially unprogrammed condition. The customer may use equipment (referred to as a device "programmer") to program or configure the device 10 so that device 10 performs a desired custom logic function and so that the input-output circuitry 16 provides desired I/O functionality. Sometimes two or more conductors must be selectively connected to a third conductor. This type of function may be performed using transistors such as transistor 32 of FIG. 1. The gate control circuitry 30 for controlling such transistors 32 may be based on a random-access memory cell that has been provided with suitable programming data (also sometimes called configuration data) from the programmer. As shown in FIG. 3, the programming data may be provided to device 10 using a programming data input 40. If desired, input 40 may be used for other functions after the programming data has been received.

The random-access memory cells 42 (sometimes also called configuration RAM, configuration cells, configuration RAM cells, or function control elements) may be configured by loading the programming data using any suitable arrangement. For example, the configuration cells may be linked together with connectors to form one or more chains of configuration cells. The cells in the chains may then be configured by serially loading programming data into the cells from the periphery of device 10. The programming data consists of binary 1's and 0's that, once loaded into the configuration cells, direct the cells to provide either a logic high (e.g., a "1") or a logic low (e.g., a "0") at their outputs. The cell outputs may then be used to control (and thereby customize) the logic components on device 10.

The logic components that are customized by the configuration RAM 42 contain the transistors 32 that are turned on or off depending on the control signal output provided by an associated configuration RAM cell 42. In the arrangement of FIG. 3, some transistors 32 are shown as being individually disposed between interconnection lines 14. When transistors 32 are used in this type of context they may be referred to as "pass transistors." Transistors 32 may also be used to form the internal components in multiplexers 44 and other programmable logic 46. When used in a multiplexer 44, the transistors may be selectively turned on or off to configure the multiplexer, thereby allowing certain multiplexer input signals to be provided as multiplexer output signals.

Any suitable architecture may be used for programmable logic device 10. In the illustrative arrangement shown in FIG. 3, some of the programmable logic is arranged in programmable logic regions 48 that may be referred to as "logic array blocks." Such regions 48 may include smaller logic regions that may be referred to as "logic elements." Each logic element may have a number of outputs and a number of inputs. The input and output signals associated with the logic elements may be routed within the logic array blocks using intra-region conductors and may be routed between logic array blocks using inter-region conductors. Registers such as register 52 may be used to register some or all of the input and output signals from the logic elements.

Figure 4:
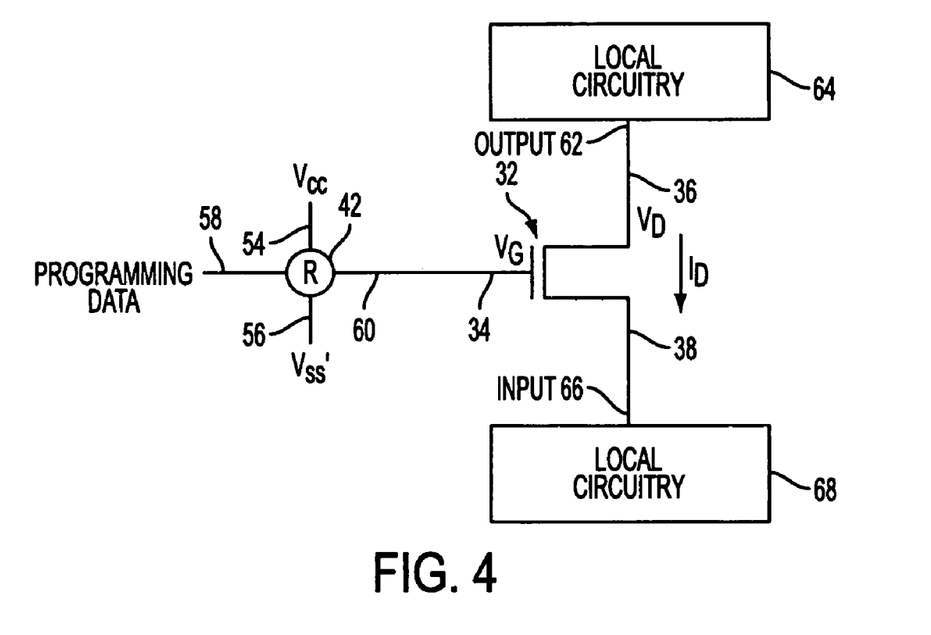
FIG. 4 is a diagram showing how a control circuit such as a configuration random-access-memory cell may be used to control a transistor on a programmable logic device in accordance with the present invention.

Some of the conductors 14 shown in the example of FIG. 4 are interconnected by transistors 32. Conductors 14 may also be connected in this way using transistors 32 in multiplexers 44 and other programmable logic 46. In certain circuit locations (e.g., when transistors are used as pass transistors to interconnect conductors 14 such as those shown in FIG. 3 and thereby selectively electrically connect one logic region 48 to another), the performance of transistors 32 is particularly important. Accordingly, it is often necessary for these transistors to have low thresholds (particularly when the supply voltage Vcc that is being used is relatively small). To prevent these transistors from contributing an undesirable amounts of leakage current and thereby increase the standby power consumption of device 10 (particularly when these transistors have shorter gates), all or at least some of the configuration RAM cells 42 may be used to turn these transistors off using Vss', rather than Vss. (Vcc may still be used to turn the transistors on.)

As shown in FIG. 4, configuration RAM cell 42 (or another suitable function control element) may be provided with voltage signals Vcc and Vss. The voltage Vcc may be provided at one or more inputs such as input 54. The voltage Vss' may be provided at one or more inputs such as input 56. Configuration data may be supplied to configuration RAM cells such as configuration RAM cell 42 of FIG. 4 using one or more inputs such as programming data input 58. When configuration RAM cells 42 are linked together to form a configuration RAM chain, the input 58 of each cell may be connected to the output of the previous cell in the chain.

Depending on the configuration data bit loaded into a given configuration RAM cell, that RAM cell may provide either a control voltage of Vcc or a control voltage of Vss' at its output 60. When the voltage Vcc is supplied at output 60, the gate 34 of the associated transistor 32 is taken high, which turns on transistor 32 and allows signals to pass from the output 62 of a first region of logic (logic circuitry 64) to the input 66 of a second region of logic (logic circuitry 68). Logic circuitry 64 and logic circuitry 68 may include any of the logic circuitry of programmable logic device 10.

When the voltage Vss' is supplied by configuration RAM cell 42 at output 60, the gate 34 of corresponding transistor 32 is provided with a reverse bias signal (e.g., −0.2 volts). The reverse bias control signal Vss' acts as a logic low that turns off the transistor 32 significantly more than a logic low formed using a ground potential of Vss (0 volts), thereby reducing the leakage current of transistor 32. By using this arrangement to turn off many or most of the programmable transistors on device 10, substantial reductions in the standby power of device 10 can be achieved.

Figure 5:
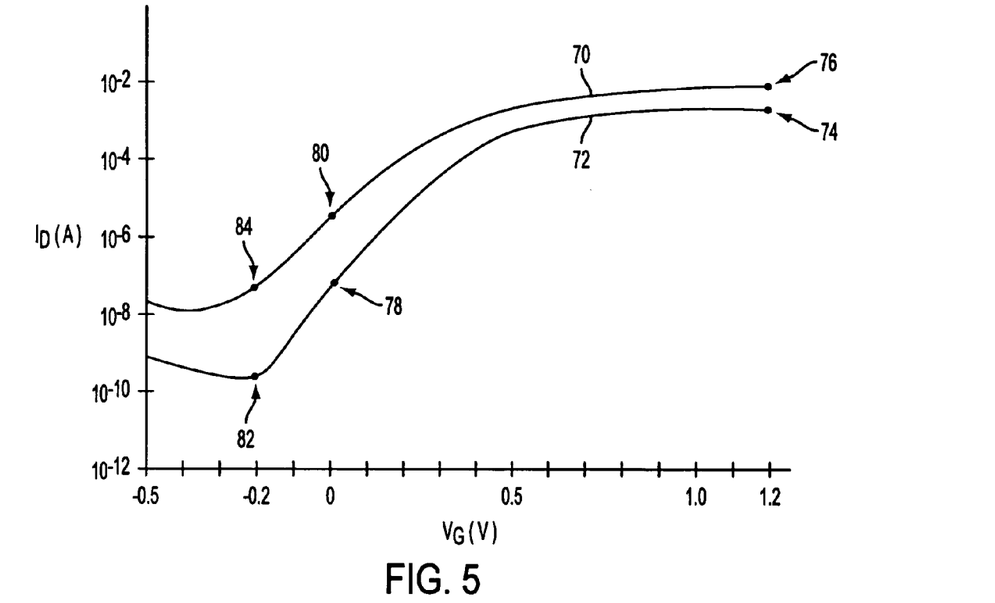
FIG. 5 is a graph of minimum and maximum calculated transistor drain currents versus applied gate voltage in accordance with the present invention.

The amount of leakage current reduction that may be produced by using Vss' rather than Vss to turn off transistors 32 may be quantified using the graph of FIG. 5. Two source-drain current ($I_D$) versus gate voltage ($V_G$) curves have been plotted in the graph of FIG. 5. The upper curve 70 represents the source-drain current through transistor 32 when the voltage at output 62 of FIG. 4 is high (e.g., 1.2 volts) while the voltage at input 66 of FIG. 4 is low, whereas the lower curve 72 represents the source-drain current when the voltages at output 62 and input 66 are both low. During normal operation, high-frequency digital data is generally passing between output 62 and input 66 (when not being prevented from passing by turning transistor 32 off). Accordingly, typical values of $I_D$ during operation will fall between the maximum given by curve 70 and the minimum given by curve 72.

As shown in FIG. 5, when transistor 32 is turned on (e.g., when the bias voltage provided by configuration RAM cell 42 to gate 34 is 1.2 V), the transistor 32 may conduct a current of about $10^{-4}$ A (e.g., a current having a magnitude between the lower and upper bounds represented by points 74 and 76). (The actual current values shown in the graph of FIG. 5 are merely illustrative. Transistors of different sizes and corresponding currents may be used if desired.)

When transistor 32 is turned off using the gate voltage $V_G$ of Vss, $I_D$ is lowered to a current having a magnitude between the lower and upper bounds represented by points 78 and 80. This off-state current is about $10^{-7}$ A, which is substantially lower than the on-state current of $10^{-4}$ A, but is still high enough to make a non-negligible contribution to the standby power consumption of circuit 20 (e.g., to the programmable logic device 10).

Because the transistor 32 is turned off when the applied gate voltage $V_G$ is equal to Vss, the current $I_D$ under these conditions is referred to as a "leakage current." To reduce the leakage current of transistor 32 and to thereby reduce the standby power consumption of integrated circuit 20 (FIG. 1), the transistor 32 may be turned off using a negative or reverse-bias gate voltage of Vss' (−0.2 volts in the present example).

When transistor 32 is turned off using the voltage Vss', $I_D$ will be reduced to an even lower current $I_D$. As shown in the graph of FIG. 5, for example, $I_D$ under these conditions has a magnitude between the lower and upper bounds represented by points 82 and 84. This reduced off-state current is about $10^{-9}$ A, which is substantially lower (about two orders of magnitude lower) than the off-state current of $10^{-7}$ A that is obtained when transistor 32 is turned off using a gate voltage $V_G$ of Vss (0 volts in the present example). Because leakage current is reduced significantly by using Vss' rather than Vss to turn of transistor 32, applying Vss' to the transistors on a programmable logic device 10 or other integrated circuit 20 helps to reduce the standby power dissipation of that circuit.

Figure 6:
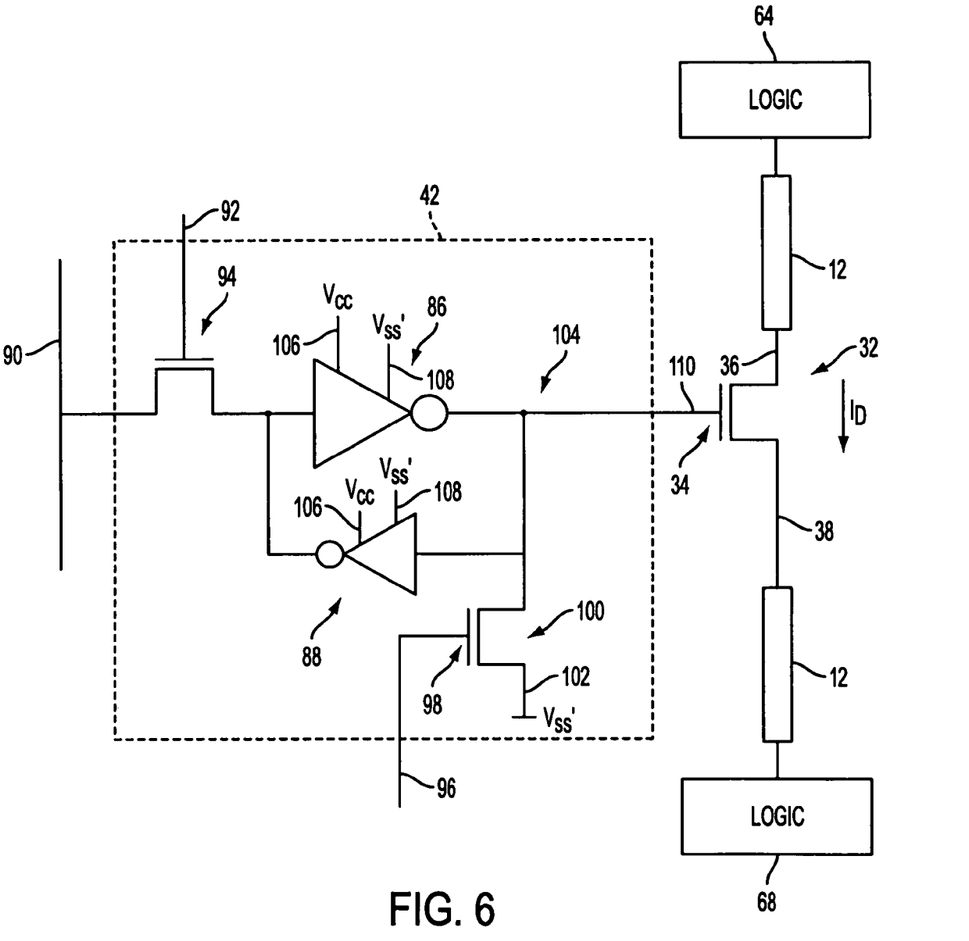
FIG. 6 is a diagram of an illustrative configuration random-access-memory cell and corresponding transistor controlled by the output of the cell in accordance with the present invention.

Any suitable configuration RAM cell circuit arrangement may be used to provide the voltage Vss' to transistors such as transistor 32. An illustrative circuit arrangement for a configuration RAM cell 42 is shown in FIG. 6. As shown in FIG. 6, at least part of the electrical pathway between one region of logic 64 on programmable logic device 10 and another region of logic 66 on the device 10 may be made up of non-negligible lengths of interconnect 12.

In general, transistors such as transistor 32 may be used to couple together any circuitry or logic components on device 10. Nevertheless, the performance of transistor 32 is particularly important in speed critical situations in which high-speed data is being conveyed from one logic region to another over interconnect lines such as lines 12 of FIG. 6. In these situations, transistor 32 serves as a "pass transistor" and is generally provided with a low threshold voltage to ensure good performance, particularly when its gate length is short (e.g., 90 nm or less).

Lower voltage thresholds may improve pass transistor speed performance by 20% or more. Because leakage current values tend to be larger in low-threshold-voltage transistors than in high-threshold-voltage transistors, the use of configuration RAM cell 42 to turn off pass transistor 32 of FIG. 6 using a gate voltage $V_G$ of Vss may be particularly beneficial. Moreover, because it is generally not known in detail how a particular programmable logic device 10 will be configured by a user, the ability to reduce leakage current on a transistor-by-transistor basis as is possible when using RAM-cell-based reverse-bias leakage reduction scheme can be important.

With the illustrative configuration RAM cell arrangement of FIG. 6, programming data is supplied to cross-coupled inverters 86 and 88 from data line 90. Address line 92 is used to turn on and off transistor 94, to selectively provide the programming data to the storage latch made up of inverters 86 and 88. As shown in the drawing of FIG. 6, inverters 86 and 88 do not have the same strength, which prevents contention between these two components and ensures that the latch formed by inverters 86 and 88 may be placed into a stable state when a configuration data bit is loaded from data line 90.

Various data and address line arrangements may be used to provide data to configuration RAM cells such as cell 42 of FIG. 6. With one suitable approach, data lines such as data line 90 may be used to provide a path for programming data that is coupled to multiple configuration RAM cells. Address lines are used to selectively direct the programming data to the correct RAM cells. With another suitable approach, configuration cells may be linked together to form a chain (e.g., a chain or configuration registers). With this type of chain configuration, data for each of the cells in the chain may be "clocked" into the chain from an input at one of the chain's ends.

A clear line such as clear line 96 may be used to control the gate 98 of cell clear transistor 100. Transistor 100 may be provided with a medium threshold voltage (or a high or low threshold voltage). The reverse bias voltage Vss' may be supplied at the source terminal 102 of clear transistor 100. When clear line 96 is taken high, the voltage signal Vss' is applied to node 104, which clears the contents of the latch formed by inverters 86 and 88 (i.e., node 104 is taken low and transistor 32 is turned off with voltage Vss').

As shown by power supply input lines 106 and 108, the circuitry of inverters 86 and 88 may be powered using positive power supply voltage Vcc and using the reverse-bias voltage Vss' in place of ground voltage Vss. This arrangement allows the output of inverter 86 and therefore the output 110 of cell 42 to be driven at either Vcc or Vss', depending on the value of the configuration data bit that is provided to cell 42 using data and address lines 90 and 92 and stored in inverters 86 and 88. The output 110 of cell 42 can be programmed to be Vcc when it is desired to turn on transistor 32. The output 110 of cell 42 can be programmed to be Vss' to turn off transistor 32 with a reverse bias and therefore produce a low leakage current $I_D$.

Cell 42 may be used to apply reverse-bias voltage Vss' to a pass transistor such as pass transistor 32 of FIG. 6 or any other suitable transistor on programmable logic device 10 or other integrated circuit 20. If desired, the voltage Vss' may be used to turn off transistors such as the configuration RAM transistors 100 and 94, thereby reducing their leakage current and further reducing the standby power consumption of the device. To control configuration RAM transistors such as transistors 100 and 94 using Vss', the address line and clear line control circuitry that is used to turn on and off transistors 100 and 94 may be provided with power supply voltages of Vcc and Vss' (using lines like lines 106 and 108).

In some integrated circuits 20, it may be desired to use Vss' in place of Vss only for the lowest voltage threshold transistors and the transistors in the most critical speed paths. This approach will tend to minimize the amount of on-circuit charge pump circuitry 28 that is provided on the chip (or the number of Vss' distribution lines if Vss' is provided using an external source). In other integrated circuits 20, Vss' may be used in place of Vss extensively, in low-threshold-voltage, medium-threshold-voltage, and high-threshold voltage situations and in situations having both low-performance requirements and high-performance requirements. If desired, Vss' may be used for all (or substantially all) transistors that are turned on and off in an essentially static fashion (e.g., all configurable transistors). These are merely illustrative arrangements with which the reverse bias voltage Vss' may be used to reduce the standby power of device 20. Any other suitable arrangements may be used if desired.

Figure 7:
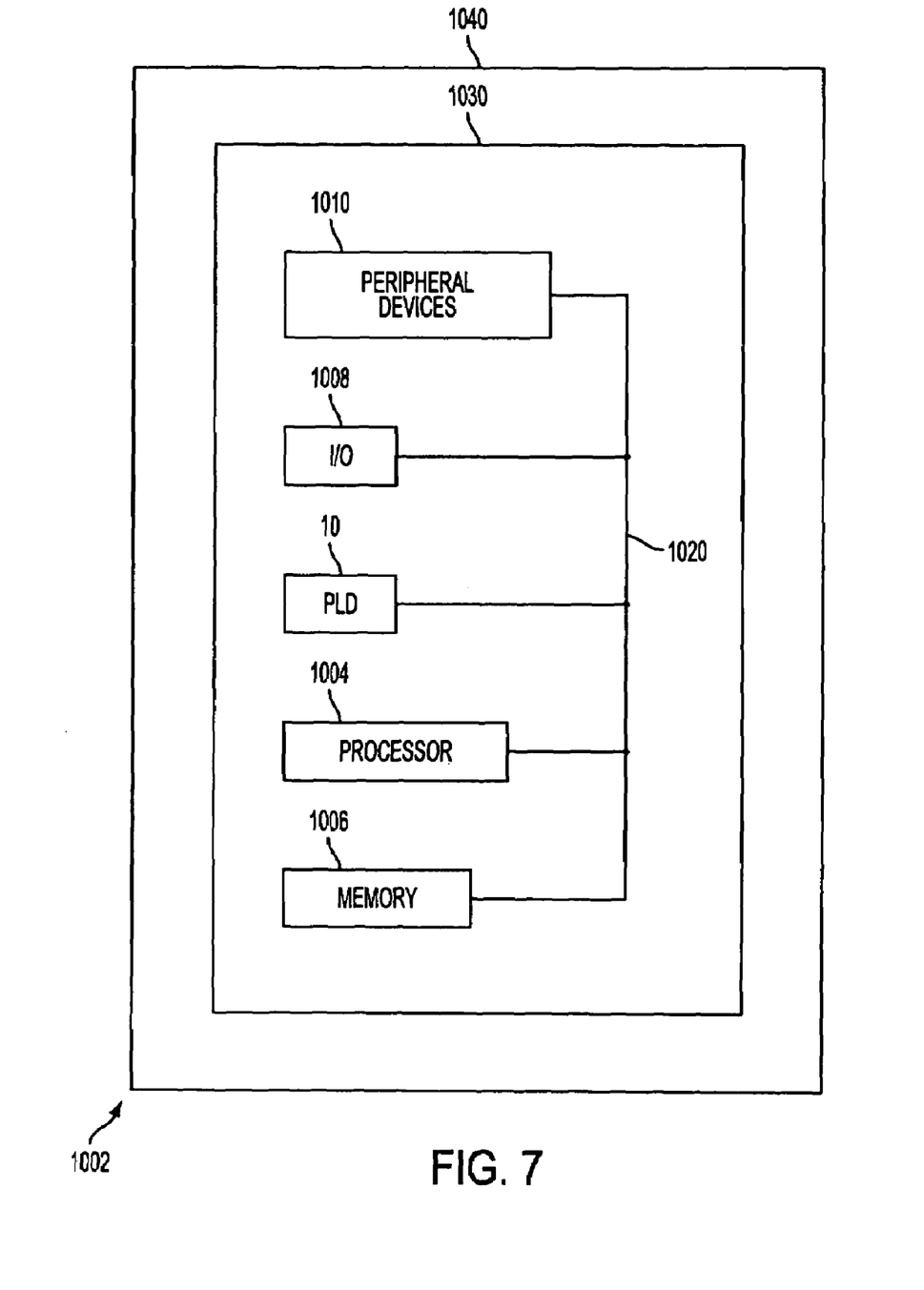
FIG. 7 is a diagram of an illustrative system that includes one or more integrated circuits having circuitry for reducing standby power consumption in accordance with the present invention.

The reduction in standby power consumption that is produced using Vss' to turn off transistors in circuit 20 helps to reduce the standby power consumption of systems in which system 20 is used. An illustrative data processing system 1002 in which an integrated circuit 20 with reduced standby power consumption such as a programmable logic device 10 with reduced standby power consumption may be used is shown in FIG. 7. Data processing system 1002 may include one or more of the following components: a processor 1004, memory 1006, I/O circuitry 1008, and peripheral devices 1010. These components may be coupled together by a system bus 1020 and may be populated on a circuit board 1030 which is contained in an end-user system 1040.

System 1002 can be used in a wide variety of applications, such as computer networking, data networking, instrumentation, video processing, digital signal processing, or any other application where the advantage of using programmable or reprogrammable logic is desirable. Programmable logic device 10 (or other circuit 20) can be used to perform a variety of different logic functions. For example, programmable logic device 10 can be configured as a processor or controller that works in cooperation with processor 1004. Programmable logic device 10 may also be used as an arbiter for arbitrating access to a shared resource in system 1002. In yet another example, programmable logic device 10 can be configured as an interface between processor 1004 and one of the other components in system 1002. It should be noted that system 1002 is only exemplary.

Various technologies can be used to implement programmable logic devices 10 and other integrated circuits 20 that have the standby power reduction capabilities of the present invention. The components of the devices such as transistors 32 and the control circuitry for turning on and off such transistors may have various configurations. For example, the transistors 32 may be used in programmable components such as the multiplexers 44 and other programmable logic 46 and the control circuitry that controls these transistors may be based on programmable RAM cells 42 or other function control elements that control transistors 32. Each programmable component can be a relatively simple programmable connector such as a switch or a plurality of switches for connecting any one of several inputs to an output. Alternatively, each programmable component can be a somewhat more complex element which is capable of performing logic (e.g., by logically combining several of its inputs) as well as making a connection. In the latter case, for example, each programmable component can be product term logic, implementing functions such as AND, NAND, OR, or NOR. Examples of transistor types suitable for implementing programmable components are EPROMs, EEPROMs, pass transistors, transmission gates, etc. These transistors can be turned off using reverse-bias voltage Vss', which reduces standby power consumption.

As has been mentioned, one or more of the transistors in the programmable components of device 10 can be controlled by various programmable, function control elements such as programmable RAM cells 42. Functions control elements such as these can be implemented in any of several different ways. For example, function control elements can be based on SRAMs, DRAMs, first-in first-out ("FIFO") memories, EPROMs, EEPROMs, registers, ferro-electric memories, fuses, antifuses, or the like. From the various examples mentioned above it will be seen that this invention is applicable to both one-time-only programmable and reprogrammable devices 10 as well as other integrated circuits 20 that contain transistors 32.

If desired, the numbers of the various types of resources on circuit 20 can be different from the numbers present in the depicted and described illustrative embodiments. This applies to such parameters as the numbers of rows and columns of the various types of circuitry, the number of regions 12, the numbers of the various types of interconnection conductors, the number and types of I/O drivers, and the numbers and sizes of the configuration RAM cells or other function control elements used to control the circuitry. The logic used in programmable logic device 10 to perform various programmable logic functions may be look-up table logic. It will be understood that other types of logic may sometimes be used instead if desired. For example, sum-of-products logic may sometimes be used instead of look-up table logic. Although illustrated herein in the context of a certain programmable logic device architectures, it will be understood that various aspects of the invention are equally applicable to other programmable logic devices and integrated circuits as well.

The foregoing is merely illustrative of the principles of this invention and various modifications can be made by those skilled in the art without departing from the scope and spirit of the invention.

What is claimed is:

1. An integrated circuit device comprising:
   at least one pass transistor having a gate terminal; and
   control circuitry comprising a memory element, wherein the control circuitry turns the pass transistor off by storing a reverse-bias voltage in the memory element and applying the reverse-bias voltage to the gate terminal of the pass transistor.

2. The integrated circuit device of claim 1 wherein the memory element comprises a configuration RAM cell.

3. The integrated circuit device of claim 1 wherein the pass transistor has non-negligible leakage current when turned off by applying a ground voltage to its gate terminal.

4. The integrated circuit device of claim 3 wherein the leakage current of the pass transistor is substantially reduced when the reverse-bias voltage is applied to the gate terminal of the pass transistor.

5. The integrated circuit device of claim 1 wherein the control circuitry turns the pass transistor on by applying a power supply voltage to the gate terminal of the transistor.

6. The integrated circuit device of claim 1 wherein the pass transistor is coupled between two regions of logic, and wherein the pass transistor substantially couples signals between the two regions of logic when a power supply voltage is applied to the gate terminal.

7. The integrated circuit device of claim 1 wherein the pass transistor has a low threshold voltage.

8. The integrated circuit device of claim 1 wherein the pass transistor is used for speed-sensitive signal transmission.

9. An integrated circuit comprising:
   circuitry that is operated with a first positive and a first negative power supply; and
   a memory cell coupled to said circuitry, the memory cell being capable of storing a voltage substantially lower than said first negative power supply, said memory cell comprising:
      a first inverter comprising an input and an output node, said first inverter being coupled to said first positive power supply and to a second negative power supply, said second negative power supply supplying a voltage substantially lower than that of said first negative power supply; and
      a second inverter comprising an input node coupled to the output of the first inverter, and an output node coupled to the input of the first inverter, said second inverter being coupled to said first positive power supply and to said second negative power supply.

10. The integrated circuit of claim 9 further comprising:
    memory access circuitry coupled to said memory cell, said memory access circuitry being used to write data to said memory cell, said memory access circuitry comprising a transistor connected between a data line and the input of said first inverter, said transistor being used to selectively couple the data line to the input of said first inverter.

11. The integrated circuit of claim 9 further comprising:
    a transistor coupled between the output node of the first inverter and said second negative power supply, the gate terminal of the transistor being controlled by a clear line, wherein a power supply voltage is applied to said clear line to reset the voltage stored by said memory cell.

12. The integrated circuit of claim 9 further comprising:
    a pass transistor, the gate terminal of the pass transistor being coupled to the output node of the first inverter.

13. A method for reducing the power consumption of a pass transistor coupled between two regions of logic, the method comprising:
    storing a reverse-bias voltage on a memory element coupled to the gate of the pass transistor; and
    applying the reverse-bias voltage to the gate terminal of the pass transistor when it is desired to electrically isolate the two regions of logic, in order to reduce the leakage current of the pass transistor.

14. The method of claim 13 wherein the memory element comprises a configuration RAM cell.

15. The method of claim 13 wherein the pass transistor has non-negligible leakage current when turned off by applying a ground voltage to its gate terminal.

16. The method of claim 15 wherein the leakage current of the pass transistor is substantially reduced when the reverse-bias voltage is applied to the transistor's gate terminal.

17. The method of claim 13 wherein the pass transistor has a low threshold voltage.

18. The method of claim 13 wherein the pass transistor substantially couples signals between the two regions of logic when a power supply voltage is applied to its gate terminal.

19. The method of claim 13 wherein the pass transistor is used for speed-sensitive signal transmission between the two regions of logic when the transistor is turned on.

20. The method of claim 13 wherein the memory element is coupled to a negative power supply, said negative power supply providing the reverse-bias voltage.

* * * * *